United States Patent [19]

Chiong et al.

[11] Patent Number: 4,980,264
[45] Date of Patent: Dec. 25, 1990

[54] PHOTORESIST COMPOSITIONS OF CONTROLLED DISSOLUTION RATE IN ALKALINE DEVELOPERS

[75] Inventors: Kaolin N. Chiong, Pleasantville; Bea-Jane L. Yang; Jer-Ming Yang, both of Yorktown Heights, all of N.Y.

[73] Assignee: International Business Machines Corporation, Armonk, N.Y.

[21] Appl. No.: 809,948

[22] Filed: Dec. 17, 1985

[51] Int. Cl.$^5$ .................... G03F 7/012; G03F 7/023; G03F 7/004

[52] U.S. Cl. .................... 430/192; 430/193; 430/197; 430/270; 430/325; 430/326; 430/330

[58] Field of Search ................ 430/192, 191, 197, 270

[56] References Cited

U.S. PATENT DOCUMENTS

| | | | |
|---|---|---|---|
| 3,802,885 | 4/1974 | Lawson | 430/192 |
| 3,869,292 | 3/1975 | Peters | 430/197 |
| 4,009,033 | 2/1977 | Bakos et al. | 430/191 |
| 4,108,666 | 8/1978 | Hayashi et al. | 96/115 P |
| 4,115,128 | 9/1978 | Kita | 430/191 |
| 4,442,195 | 4/1984 | Yamamoto et al. | 430/191 |
| 4,524,121 | 6/1985 | Gleim et al. | 430/176 |
| 4,551,409 | 11/1985 | Gulla et al. | 430/197 |
| 4,564,575 | 1/1986 | Perreault et al. | 430/192 |

OTHER PUBLICATIONS

DeForest, W. S., "Photoresist Materials and Processes", McGraw-Hill Book Co., 1975, pp. 47-59.

Primary Examiner—Charles L. Bowers, Jr.
Attorney, Agent, or Firm—Perman & Green

[57] ABSTRACT

A photoresist composition is disclosed which is a mixture of a photoactive compound and an alkali soluble resin binder comprises of an unsaturated dicarboxylic acid esterified polymeric material, such as a phenolic resin containing a plurality of acid esterifiable groups esterified with an unsaturated dicarboxylic acid anhydride having the formula

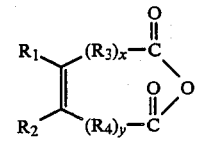

wherein $R_1$ and $R_2$ are independently selected from hydrogen and alkyl groups containing 1 to 3 carbon atoms, $R_3$ and $R_4$ are alkylene groups containing 1 to 3 carbon atoms and x and y are either 0 or 1.

8 Claims, No Drawings

PHOTORESIST COMPOSITIONS OF CONTROLLED DISSOLUTION RATE IN ALKALINE DEVELOPERS

BACKGROUND OF THE INVENTION

1. Field of the Invention

This invention relates to photoresists, and more particularly to photoresists that have a low optical density, a high sensitivity towards cross-linking and a controllable dissolution rate in alkaline developers, and most particularly, to photoresist compositions comprising a light sensitive compound in an aqueous alkali soluble binder comprised of an unsaturated dicarboxylic acid anhydride esterified resin such as a phenolic resin, e.g., a novolak type cresolformaldehyde resin or a poly (p-hydroxystyrene).

2. The Prior Art

Photoresist compositions are well known in the art. When exposed to activating radiation, such as ultraviolet photons, the photoresist composition is chemically altered in its solubility to certain solvents (developers). Two types are known. The negative acting resist is initially a composition which is soluble in its developer but following exposure to actinic radiation becomes less soluble in the developer thereby defining a latent image. Positive acting resists work in the opposite fashion, actinic radiation making the resist more soluble in the developer. In resist patterning, photons of shorter wavelengths, e.g. less than about 300 nanometers (nm) are preferably employed because the resolution of printing is limited by diffraction.

Photoresist compositions known to the art generally comprise a light sensitive compound in a film forming polymeric binder. The resin binder most frequently used are the alkali soluble phenolic resins, e.g., cresol-formaldehyde resins. These materials are the product of a reaction of cresol and formaldehyde under conditions whereby a thermoplastic (novolak) polymer is formed. Photoresist compositions are prepared using the novolak type cresol formaldehyde resin by incorporating therein a photoactive compound, a socalled sensitizer, for instance, one of the group of the 4- or 5- substituted naphthoquinone -1,2-diazidesulfonic acid esters.

In the prior art, the above described photoresist compositions using novolak resins as a binder are most often used as masks to protect substrates during the etching step in the manufacture of semiconductors. In such manufacture, the photoresist is coated onto the surface of a semiconductor substrate as a thin film about 0.5 to 3 microns in thickness and then imaged and developed to remove soluble portions thereof. The resist medium remaining on the surface of the substrate is then employed as a protective mask to facilitate the selective etching as by reactive ion etching of the exposed portions of the substrate thereby defining a circuit pattern.

Phenolic resins are advantageously used as the binder in resist formulations because they are resistant to reactive-ion etching processing commonly used in semiconductor manufacturing. However, resists formulated with phenolic resin such as novolac resins or poly(p-hydroxystyrene) are not suitable for exposure with photons of shorter wavelengths (i.e. less than 300 nanometers) because these resins absorb these photons strongly. In order to achieve submicron fine-line lithography, the optical absorption at the exposure region must be low and the photosensitivity high. Novolac resins and poly(p-hydroxystyrene) have low photosensitivity towards deep UV (i.e. 200–300 nanometers) photons. To increase the photosensitivity of these resins photoactive compounds are incorporated in the phenolic-resin based resist formulations. The additional optical absorption of these photoactive compounds disadvantageously effects the low optical absorption requirement for fine line lithography using deep UV exposure. Typically, more than 15 weight percent of photoactive compounds in the resist formulation are required to achieve reasonable resist performance. For example, about 15 to 30 weight percent of napthoquinone -1,2-diazide-sulfonic acid esters are used in novolac type cresol-formaldehyde resins to formulate conventional positive resists, and about 10 to 25 weight percent of aryl bisazides are incorporated in poly(p-hydroxystyrene) to formulate alkali soluble negative resists. The high optical absorption of these photosensitized resists in deep UV region precludes uniform photolysis through the resist films, and consequently high-resolution resist delineation is not achievable. Resins with lower optical absorptivity in deep UV region, such as poly(methacrylic acid-co-methyl methacrylate) and poly(methacrylic acid-co-ethyl methacrylate-costyrene), have been used as the binder material in deep-UV resist formulations, but again the amount of photoactive compound (such as aryl bisazides or naphthoquinone-1,2-diazide-sulfonic acid esters) required to yield reasonable resist performance is too high to meet the low optical-absorption requirement. Furthermore, the etch resistance and thermal stability of resist films based on methacrylic acid-containing resins are inferior to phenolic resins.

Another problem associated with the use of phenolic resins as photoresist materials is that the synthesis of the resins is difficult to control within precise limits so that batch-to-batch variations in resin alkali solubility results. In many cases the photoresist systems exhibit high dissolution rates for development in alkaline solutions normally used as developers. The very high dissolution rates prevent adequate control over processes to obtain fine line configurations. Attempts to decrease the dissolution rate by increasing the concentration of the sensitizer in the photoresist, as has already been discussed increases the optical absorption of the resist to the point where full penetration of the film thickness by actinic radiation may be substantially lost.

The prior art has attempted to use acetylation of the phenolic hydroxyl group of the phenolic resins as a means to reduce the optical absorptivity of the resist formulations based on these resins or to decrease the dissolution rate of the resist films. For example, in copending patent application Ser. No. 560,781 filed Jan. 30, 1984 there is disclosed acetylation of the phenolic hydroxyl groups of novolak resins with an anhydride of an aliphatic monoacid containing 2–5 carbon atoms e.g. acetic anhydride. However, acetylation of the phenolic hydroxyl groups, even at fairly low percentages of conversion results in a partially esterified phenolic resin which is insoluble in alkaline solutions thereby requiring the use of organic solvents as developer solutions. Development of the resist patterns in organic solvents generally causes resist pattern distortion, resulting in poor sub-micron resolution.

There is, therefore, a need in the art to provide alkali-soluble resin binder based photoresists with high etch resistance and low optical absorption in deep ultraviolet (i.e. 200–300 nanometers) and to control the dissolution rate of the photoresist in alkaline developer solutions.

SUMMARY OF THE INVENTION

It has now been found that the dissolution rate of image exposed photoresist systems (such as those based on acid-esterifiable group containing resins such as phenolic resins) may be controlled, so that the solubility of the resin in alkaline solutions is retained while the reactivity of the resin is enhanced, by using as a binder an alkali-soluble resin comprised of an unsaturated dicarboxylic acid esterified polymeric material such as a phenolic resin containing a plurality of acid esterifiable groups which have been partially esterified, i.e. condensed with an unsaturated dicarboxylic anhydride having the formula

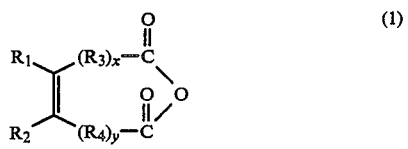   (1)

wherein $R_1$ and $R_2$ are independently selected from hydrogen and alkyl groups containing 1 to 3 carbon atoms, $R_3$ and $R_4$ are alkylene groups containing 1 to 3 carbon atoms and x and y are either 0 or 1.

As will hereinafter be illustrated, by substituting an unsaturated acid anhydride modified alkali-soluble acid esterifiable group containing resin such as an alkali-soluble hydroxyl group containing phenolic resin/unsaturated dicarboxylic anhydride condensation product for the unmodified resin in the preparation of the photoresist, the dissolution rate of the image-wise exposed photoresist may be modified to provide a tailored development rate within a desired range due to the modified dissolution rate in alkaline developers of the unsaturated acid anhydride modified resin.

Thus, the dissolution rate of modified resins can be tailored by adjusting the percentage of esterification on the available phenolic groups with the unsaturated dicarboxylic anhydride. If desired, tailoring of the dissolution rate may also be effected by esterifying phenolic groups simultaneously or sequentially with the unsaturated dicarboxylic acid anhydride in combination with an anhydride of an aliphatic monoacid such as acetic anhydride in appropriate ratios. Complete esterification of cresol-formaldehyde resin is difficult because of the steric hindrance of neighboring groups. However, complete esterification is desirable because fully esterified phenolic resins have low optical absorptivity in deep-UV region, and complete esterification is possible with phenolic resins such as poly(p-hydroxystyrene), which have less steric hindrance towards esterification as compared with cresol-formaldehyde resins.

Photoresists prepared from unsaturated dicarboxylic acid esterfied polymeric materials such as unsaturated dicarboxylic acid anhydride modified phenolic resins show increased sensitivity to actinic radiation exposure such as ultraviolet light, electron beam or x-rays.

When films of the modified phenolic resin based photoresist compositions of the present invention are exposed to deep ultraviolet light i.e. light of a wavelength of about 200-300 nm, a negative tone resist pattern is obtained. The sensitivity of the resist is enhanced to deep ultraviolet light due to the participation of the unsaturated anhydride moiety of the modified phenolic resin in the photocuring reaction. Because of the enhanced sensitivity the concentration of photosensitizer used in the negative photoresist compositions of the present invention can be lowered resulting in a reduction of the total absorption of the photoresist. Also, with respect to deep ultra-violet exposure, as the absorptivity of the unsaturated anhydride modified phenolic resin is reduced, more uniform exposure of the photoresist film is thereby obtained.

Advantageously, when the photoresist compositions of the present invention sensitized with photoactive compounds such as napthoquinone-1-2-diazide sulfonic acid esters are exposed to ultraviolet radiation of a wavelength in the mid-UV range, or near UV range, i.e. a wavelength of 300 nm or more, a positive-tone resist pattern is obtained. Thus unsaturated dicarboxylic acid esterified polymeric materials, such as the unsaturated acid anhydride modified phenolic resin based photoresist compositions of the present invention have the advantage of being adaptable for use as a binder material in positive resist or a negative resist formulations depending upon the wavelength of light and photoactive compounds used.

In addition to unsaturated acid anhydride modified phenolic resins, other polymeric materials containing a plurality of esterifiable hydroxyl, carboxylic, amine and imide —NH groups can also be modified to adjust the dissolution rate of the resin in alkaline developer solutions and to increase the reactivity of the resin towards photocrosslinking. Therefore, the practice of the present invention encompasses within its scope photoresist compositions having controllable dissolution rates in alkaline developer solutions and high reactivity toward photocrosslinking wherein the polymeric binder is a condensation product of the unsaturated dicarboxylic acid of Formula 1 above with an alkali soluble polymeric material containing a plurality of acid esterifiable groups such as a hydroxyl group containing phenolic resin or a resin with esterifiable hydroxyl, amine, or imide —NH functional groups such as polydimethylglutarimide and maleimide/styrene copolymers.

For example, poly(dimethylglutarimide) can be functionalized for use in a negative photoresist by substituting the hydrogen on nitrogen with olefinic bond-containing chain. N-Alkylation has been found to decrease the solubility of poly(dimethylglutarimide). This problem can be similarly alleviated by incorporating a carboxylic acid group in the N-alkyl chain, as illustrated in the formulae

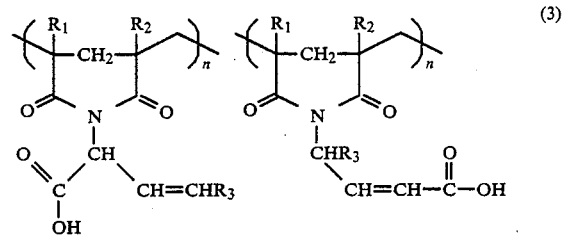   (3)

wherein $R_1$, $R_2$ are methyl groups and $R_3$ represents a hydrogen or alkyl group having 1 to 4 carbon atoms. These polymers can be prepared by imidizing the polymethyl methacrylate polymer with primary amines, which contain both carboxylic acid group and an olefinic bond.

Polymers and copolymers of maleimide can be similarly functionalized and used as the resin in negative resists, as illustrated in the formula

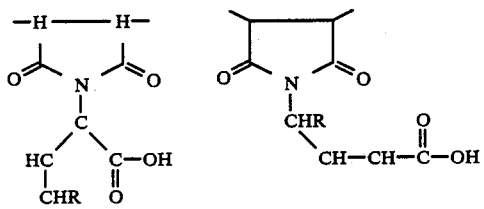

wherein R represents an alkyl group having 1 to 4 carbon atoms. Therefore, the practice of the present invention encompasses within its scope photoresist compositions having their resins with enhanced reactivity towards photocrosslinking and with proper dissolution rates in aqueous alkaline developer solutions wherein the functional groups (hydroxyl, carboxylic, amine, imide-NH) of the polymeric binder are modified so that the resin contains both a carboxylic acid group and an unsaturated olefinic bond. Without the simultaneous existence of a carboxylic acid group on unsaturated substitutents, the modified resins become less soluble or even insoluble in aqueous alkaline developers, which are preferable in manufacturing areas; the presence of an unsaturated olefinic bond in the substitutents only enhances the reactivity of resins.

DETAILED DESCRIPTION OF THE INVENTION

The term "alkali soluble phenolic resin" as the term is used herein includes within its meaning, phenolformaldehyde resins of the novolak type, i.e., one which has methylene bridges between the phenolic nuclei as shown in the following formula as a typical example.

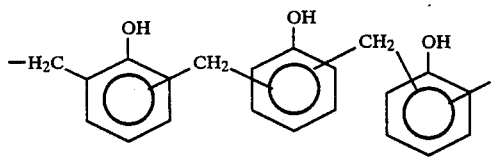
(4)

In a typical synthesis, novolaks are prepared by heating 1 mole of phenol with 0.5 mole of formaldehyde under acidic conditions. The temperatures at which the reaction is conducted are generally from about 25° to 175° C.

Preferred alkali soluble novolak-type phenol formaldehyde resins are p- or m-cresol-formaldehyde and novolak resins prepared from formaldehyde and isomers of cresol.

The term "alkali soluble phenolic resin" also includes within its meaning polyalkenyl phenols composed substantially of monomeric units having the general formula

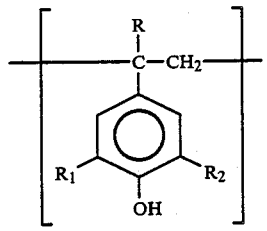
(5)

wherein R represents a hydrogen atom or an alkyl group having 1 to 4 carbon atoms and $R_1$ and $R_2$ represent a hydrogen atom or an alkyl group having 1 to 3 carbon atoms. Specific examples of polyalkenyl phenols include polyhydroxystyrene, poly-$\alpha$-methyl vinyl phenol, poly-$\alpha$-ethylvinylphenol and poly-$\alpha$-propyl vinyl phenol.

In addition to alkali soluble phenolic resins other esterifiable group containing resins may be used to prepare the unsaturated carboxylic acid esterified polymeric materials used in the practice of the present invention. Such other esterifiable group containing resins include (polyvinyl benzoic acid), and polymers and, copolymers containing, methacrylic acid, or acrylic acid, monomer units. For example, poly (vinylbenzoic acid), can be esterified with an unsaturated alcohol containing a carboxylic acid group by first converting the acid resin to its acyl chloride. Similarly polymers and copolymers of acrylic or methacrylic acid can be esterified with an unsaturated alcohol containing a carboxylic acid group.

Specific examples of unsaturated dicarboxylic acids represented by Formula (1) above, include maleic anyhydride, citraconic anhydride and itaconic anhydride. Maleic anhydride is preferred in the practice of the present invention.

The polymeric binder materials used to prepare the photoresist composition of the present invention may be prepared from condensation reactions of suitable acid esterifiable group containing resins such as an alkali soluble phenolic resin with a suitable unsaturated dicarboxylic acid anhydride. These reactions are conveniently carried out in an organic medium such as dioxane or tetrahydrofuran (THF), where the concentration of the reactive compounds is in the range of 5 to 50 percent of the solution weight; at a temperature in the range of 0° to 78° C. and at various pressures, preferably at atmospheric. The molar ratio of the acid esterifiable group containing resin to unsaturated dicarboxylic acid anhydride is in the range of about 1:1.1 The condensation reaction may be catalyzed by the presence of an organic base such as an amine, as triethylamine or pyridine. The resulting condensation product can be collected by precipitation of the condensation product into dilute acid such as HCl, filtering and then drying at 40° to 100° C., preferably under vacuum.

For purposes of illustration the reaction between an alkali soluble poly(hydroxystyrene) and an unsaturated dicarboxylic anhydride can be represented by the equation

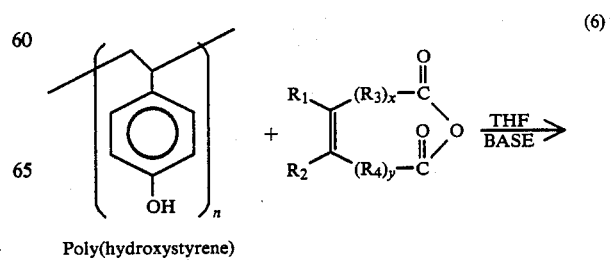
(6)

Poly(hydroxystyrene)

-continued

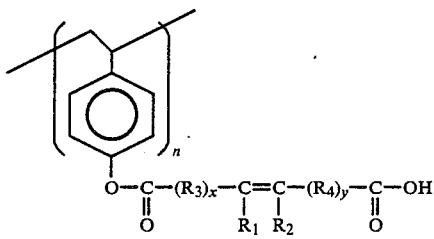

$$O-\underset{O}{\overset{\parallel}{C}}-(R_3)_x-\underset{R_1}{\overset{|}{C}}=\underset{R_2}{\overset{|}{C}}-(R_4)_y-\underset{O}{\overset{\parallel}{C}}-OH$$

To prepare a photoresist solution for coating semiconductor substrates, the acid esterifiable group containing resin/unsaturated anhydride condensation product is dissolved in a solvent for the condensation product at a solids concentration of about 10 to about 35 percent by weight. Selection of the solids concentration in the resist solution will normally be dependent on the film thickness desired and on the viscosity of the resist solution. Suitable solvents include 2-methoxy ethyl ether, 2-ethoxyethyl acetate and cyclohexanone. The solvents may be used alone or as a mixture thereof.

As the photosensitizer, for positive resists there may be dissolved in the photoresist solution diazoquinone sensitizers such as 4 or 5 - substituted napthoquinone -1-2- diazide - sulfonic acid esters of 2,3,4trihydroxybenzophenone, 4,8, bis-(hydroxymethyl) tricyclo [5.2.1.0$^{2,6}$] decane and for the spectral sensitization of negative resists, aryl azides such as 3,3'-diazido-benzophenone, di-(m-azidophenyl) sulfone and arenes such as napthothiazoline, benzothiazole or benzophenone can be used.

The amount of photosensitizer used in conjunction with the acid esterifiable group containing resin/unsaturated acid condensation product ranges in concentration from about 2 to about 25 percent by weight of the condensation product.

To form a resist mask, a thin film of the photosensitized acid esterifiable group containing resin/unsaturated anhydride condensation product is solution cast or spun onto a desired substrate. The photoresist is deposited on the substrate as a film of about 0.5 to about 20 μm in thickness and then the substrate is heated at about 80° to about 95° C. for about 15 to about 30 minutes to effect evaporation of the solvent.

The dried photoresist may then be exposed to a radiation source such as ultraviolet radiation, electron beam or x-rays. The exposure takes place either through a pattern mask or by directing a shaped beam ions, electrons or laser light across the surface of the deposited photosensitive resist film. A pattern is developed in the film to expose portions of the substrate by subjecting the film to an alkaline developer solution which removes the exposed areas of the resist when a positive photoresist is prepared and the unexposed portions when a negative resist is prepared. The irradiated film is developed by immersing, in an alkaline developer based on an alkaline solution of tetra alkyl ammonium hydroxide, sodium phosphate, sodium metasilicate, sodium or potassium hydroxide or mixtures thereof.

The present invention is illustrated in detail with reference to the following Examples, but the invention is not limited to the Examples.

EXAMPLE I

Ten grams (0.083 mole of a commercially available novolak-type m-cresol formaldehyde resin was dissolved in 100 milliliters tetrahydrofuran in a four neck, 250 ml resin flask equipped with a stirrer, and reflux condenser. 13.97 milliliters of triethylamine was added to form the salt. 8.93 grams maleic anhydride dissolved in 25 grams tetrahydrofuran was added dropwise over a period of 15 minutes into the resin solution which was stirred in an ice-water bath. After the drop-wise addition of the maleic anhydride was completed, the solution was removed from the ice bath and neutralized with HCl solution in a separatory funnel. Then, the partially esterified novolak resin was precipitated by adding the neutralized and concentrated tetrahydrofuran solution dropwise into stirred water. The precipitated condensation product was filtered and dried in a vacuum oven at a temperature of 40° C. for 24 hours. About 9 grams of the condensation product was recovered. The existence of a maleic-acid functionalized novolak resin was confirmed by IR spectrographic analysis. The absorption spectra of a 1 μm film of the maleic acid/phenolic resin condensation product was determined to have an optical density of about 0.6 at an ultraviolet wavelength of 250 nm.

A photoresist composition was prepared by dissolving 27 percent by weight of the partially esterified novolak resin in 2-methoxyether ether. The resist solution was applied to the surface of a silicon wafer having a 5000A° thermally generated oxide layer primed with a hexamethyldisilazane adhesion promoter by means of a spin coating at 3000 revolutions/min. The thickness of the resin film was 1 micron after baking the coated wafer in an oven at 80° C. for 30 minutes. The resin film was imaged in deep-UV (200-300nm) using a contact printer for 2 minutes. The exposed resist film was developed in Shipley MF 312 developer solution a tetraalkyl ammonium solution diluted at a ratio of 1:4 with deionized water. The development time was about 120 seconds and 1 μm line and space patterns were resolved.

By way of comparison when the procedure of Example 1 was repeated with the exception that the unmodified novolak resin was substituted for the maleic anhydride modified novolak resin. When such a substitution was made, the image could not be developed at all, demonstrating that the presence of the carboxylic acid groups had increased the dissolution rate of resin.

The unmodified comparative novolak resin film could be developed in ⅓ to ¼-diluted Shipley MF-312 developer, but the film was lost before the latent patterns were realized. Some latent images were observed during the initial stage of development, and these transient images could be attributed to the slightly hardened skin-layer on resin film by deep-UV photons. This result shows that the functional olefinic bonds participate in photo-crosslinking to retard dissolution.

EXAMPLE II

The procedure of Example I was repeated with the exception that 1.87 grams of the partially esterified m-cresol formaldehyde resin and 0.39 gram of 2-diazonaphthoquinone-5-sulfonic acid esters of 4,8-bis(-hydroxymethyl)tricyclo [5.2.1.0$^{2,6}$] decane were dissolved in 5.2 grams of 2-methoxyethyl ether. The spin-coated, baked 1 μm film was image-wise exposed on Perkin-Elmer projection aligner in near UV region (350-450 nm). The exposed photoresist film was then developed in 1/6 diluted Shipley 2401 (a potassium hydroxide-containing) developer for 90 seconds. Positive-tone resist patterns of 1.5 μm line-and-space were resolved demonstrating that the presence of functional olefinic bonds in the modified resin do not interfere with the positive-tone resist imaging because these olefinic bonds on maleic group do not absorb near ultraviolet photons.

EXAMPLE III

The procedure of Example 1 was repeated with the exception that 2.55 grams of the partially esterified m-cresol formaldehyde resin and 0.45 gram of 3,3'-diazidobenzophenone were dissolved in 7 grams of 2-methoxyethyl ether. The spin-coated resist film was exposed on a Perkin-Elmer projection aligner in deep-UV region (220-300nm) and developed in 1/6 diluted Shipley-2401 developer for 60 seconds. Negative-tone resist patterns of 1.25 μm line-and-space were resolved.

While specific components of the present system are defined above, many other variables may be introduced which may in any way affect, enhance, or otherwise improve the system of the present invention. These are intended to be included herein.

Although variations are shown in the present application, many modifications and ramifications will occur to those skilled in the art upon a reading of the present disclosure. These, too, are intended to be included herein.

We claim:

1. A photoresist composition comprised of an admixture of a photoactive compound and an alkali soluble resin binder which is comprised of an unsaturated dicarboxylic acid esterified polymeric material, wherein the photoactive compound is present in a concentration from about 2 to about 25 percent by weight of the resin binder.

2. The photoresist composition of claim 1 wherein the polymeric material is esterified with an unsaturated dicarboxylic acid anhydride having the formula

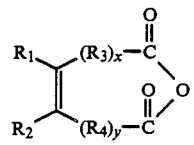

wherein $R_1$ and $R_2$ are independently selected from hydrogen and alkyl groups containing 1 to 3 carbon atoms, $R_3$ and $R_4$ are alkylene groups containing 1 to 3 carbon atoms and x and y are either 0 to 1.

3. The photoresist composition of claim 1 wherein the polymeric material is a hydroxy group containing resin selected from the group consisting of a novolak-type cresol formaldehyde resins and (poly p-hydroxystyrene).

4. The photoresist composition of claim 1 wherein the composition has positive working functionality.

5. The photoresist composition of claim 4 wherein the photoactive compound is a 4- or 5-substituted naphthoquinone (1,2) diazide-sulfonic acid ester.

6. The photoresist composition of claim 4 wherein the diazonaphthoquinone sulfonic acid ester is selected from the group consisting of 5-substituted napthoquinone-1,2-diazide sulfonic acid esters of 2,3,4-trihydroxy benzophenone and 4,8-bis(hydroxymethyl)tricyclo[5.2.1.0$^{2,6}$]decane.

7. The photoresist composition of claim 1 wherein the composition has negative working functionality.

8. The photoresist composition of claim 6 wherein the photo active compound is an aryl azide.

* * * * *